US005473183A

United States Patent [19]

Yonemoto

[11] Patent Number: 5,473,183
[45] Date of Patent: Dec. 5, 1995

[54] SEMICONDUCTOR DEVICE OF A FIRST CONDUCTIVITY TYPE WHICH HAS A FIRST WELL OF A SECOND CONDUCTIVITY TYPE FORMED THEREIN AND A SECOND WELL OF THE FIRST CONDUCTIVITY TYPE FORMED IN THE FIRST WELL AND A PAIR OF MOSFET FORMED IN THE FIRST AND SECOND WELLS

[75] Inventor: Kazuya Yonemoto, Tokyo, Japan

[73] Assignee: Sony Corporation, Tokyo, Japan

[21] Appl. No.: 301,980

[22] Filed: Sep. 7, 1994

Related U.S. Application Data

[62] Division of Ser. No. 19,641, Feb. 18, 1993, abandoned.

[30] Foreign Application Priority Data

Feb. 21, 1992 [JP] Japan .................... 4-035150

[51] Int. Cl.[6] .......................... H01L 29/76; H01L 29/94; H01L 31/062
[52] U.S. Cl. .......................... 257/371; 257/372; 257/373; 257/901
[58] Field of Search .................... 257/371, 372, 257/373, 901

[56] References Cited

U.S. PATENT DOCUMENTS

| | | | |
|---|---|---|---|
| 3,865,654 | 2/1975 | Chang et al. | 257/371 |
| 4,931,880 | 6/1990 | Yamada | 257/371 |
| 5,198,880 | 3/1993 | Taguchi et al. | 257/371 |
| 5,336,913 | 8/1994 | Fujita et al. | 257/371 |
| 5,373,476 | 12/1994 | Jeon | 257/371 |

FOREIGN PATENT DOCUMENTS

55-46504  4/1980  Japan .................... 257/372

Primary Examiner—Ngân V. Ngô
Attorney, Agent, or Firm—Hill, Steadman & Simpson

[57] ABSTRACT

The present invention is directed to a CMOS inverter in which an N-FET (Qn) formed of an N-type source region (2S), a drain region (2D) and a gate electrode (2G) and a P-FET (Qp) formed of a P-type source region (3S), a drain region (3D) and a gate electrode (3G) are formed on an N-type silicon substrate (1n). A first well region (4p) is formed under the N-FET (Qn) and P-FET (Qp). Further, an N-type well region (5n) is formed on the P-FET (Qp) within the first well region (4p). Thus, an influence exerted by a back-gate effect from the substrate can be prevented completely, whereby a phase displacement relative to a pulse response to a CMOS peripheral logic circuit and a malfunction can be avoided.

2 Claims, 7 Drawing Sheets

SEMICONDUCTOR DEVICE OF A FIRST CONDUCTIVITY TYPE WHICH HAS A FIRST WELL OF A SECOND CONDUCTIVITY TYPE FORMED THEREIN AND A SECOND WELL OF THE FIRST CONDUCTIVITY TYPE FORMED IN THE FIRST WELL AND A PAIR OF MOSFET FORMED IN THE FIRST AND SECOND WELLS

This is a division of application Ser. No. 08/019,641, filed Feb. 18,1993, now abandoned.

BACKGROUND OF THE INVENTION

1. Field of the Invention

The present invention relates generally to semiconductor devices and, more particularly, to a semiconductor device for use with a CMOS (complementary metal oxide semiconductor) inverter or the like utilized in a peripheral circuit of an image sensor formed of CCD (charge-coupled device), MOS or the like, for example.

2. Description of the Prior Art

In general, a buffer circuit is connected to a peripheral circuit of an image sensor formed of CCD, MOS or the like. For example, the buffer circuit is connected to a path through which an output signal of an image sensor is supplied to a signal processing circuit of the succeeding stage. As such buffer circuit, there are employed an inverting amplifier such as a CMOS inverter or the like, a non-inverting amplifier such as a source follower circuit or the like and a differential amplifier, etc. In a logical unit of the peripheral circuit, there are employed an inverter, an NAND circuit, etc.

FIG. 1 of the accompanying drawings is a cross-sectional view showing a structure of an example of a conventional CMOS inverter. As shown in FIG. 1, on an N-type silicon substrate $11n$, there are formed an N-channel type MOS field effect transistor (hereinafter simply referred to as an N-FET) Qn formed of an N-type source region 12S, a drain region 12D and a gate electrode 12G formed of a polycrystalline silicon layer or the like and a P-channel type MOS field effect transistor (hereinafter simply referred to as a P-FET) Qp formed of a P-type source region 13S, a drain region 13D and a gate electrode 13G formed of a polycrystalline silicon layer or the like.

In particular, under the N-FET (Qn), there is formed a P-type well region $14p$ that is used to separate the N-FET (Qn) and the silicon substrate $11n$. The P-FET (Qp) is formed on the silicon substrate $11n$ as it is.

A substrate potential Vsub is applied to the silicon substrate $11n$, a power source voltage Vdd is applied to a source region 13S of the P-FET (Qp), and a ground potential Vss is applied to a source region 12S and a well region $14p$ of the N-FET (Qn), respectively. An input signal is applied to a common terminal φin connected to the two gate electrodes 12G and 12S so that an output signal (inverter output) is output from a common terminal φout connected to the two drain regions 12D and 13D. In FIG. 1, a hatched region 11N formed near the rear surface of the substrate $11n$ represents a neutral region of the substrate $11p$ and a potential thereof is fixed to the substrate potential Vsub.

When a P-type substrate is employed as the silicon substrate, as shown in FIG. 2, the P-FET (Qp) is formed within an N-type well region $14n$ formed on the P-type silicon substrate $11p$. The N-FET (Qn) is formed on the silicon substrate $11p$ as it is.

The image sensor formed of CCD, MOS or the like performs an operation in which signal charges within a light sensing unit are temporarily discharged to the substrate side (electronic shutter operation and reset operation).

When the image sensor carries out the electronic shutter operation, the substrate potential Vsub is changed. As shown in FIG. 1, for example, the P-FET (Qp) formed on the silicon substrate $11n$ is affected by a back-gate effect from the substrate $11n$ and a Vth is fluctuated. On the other hand, the N-FET (Qn) is not affected by the substrate potential Vsub because the potential of the neutral region 14N (shown hatched) of the well region $14p$ is fixed to the ground potential Vss.

If the Vth of the FET constructing the CMOS inverter is fluctuated, then an operation point of the CMOS inverter is changed. There is then the disadvantage that an output (output signal) of the inverter is inverted. As a result, a phase displacement relative to a pulse response such as an image sensor peripheral logic circuit, an analog circuit or the like and a malfunction will occur.

This is also true in the CMOS inverter shown in FIG. 2. In this case, the N-FET (Qn) that is formed on the silicon substrate $11p$ as it is affected by a back-gate effect from the substrate $11p$. As a result, a Vth is fluctuated and the image sensor peripheral circuit, the analog circuit, etc., will malfunction.

OBJECTS AND SUMMARY OF THE INVENTION

Therefore, it is an object of the present invention to provide an improved semiconductor device in which the aforesaid shortcomings and disadvantages encountered with the prior art can be eliminated.

More specifically, it is an object of the present invention to provide a semiconductor device in which an influence of a back-gate effect from a substrate can be avoided completely.

It is another object of the present invention to provide a semiconductor device in which a phase displacement to a pulse response of an image sensor peripheral logic circuit, an analog circuit or the like and a malfunction can be avoided.

According to a first aspect of the present invention, there is provided a semiconductor device which comprises a semiconductor substrate of a first conductivity type, a first well of a second conductivity type formed in the semiconductor substrate and having at least a pair of MOS field effect transistors, one of which is the second conductivity type and a second well of the first conductivity type formed in the first well having the second conductivity type MOS field effect transistor.

According to a second aspect of the present invention, there is provided a semiconductor device supplied with a variable voltage which comprises a semiconductor substrate of a first conductivity type, a first well of a second conductivity type formed in the semiconductor substrate, a second well of the first conductivity type formed in the first well and an MOS field effect transistor of the second conductivity type formed on the surface of the second well.

According to a third aspect of the present invention, there is provided a semiconductor device supplied with a variable voltage which comprises a semiconductor substrate of a first conductivity type, a first well of a second conductivity type formed in the semiconductor substrate, a first MOS field effect transistor of the first conductivity type formed on the surface of the first well, a second well of the first type formed in the first well and a second MOS field effect transistor formed on the surface of the second well.

According to a fourth aspect of the present invention, there is provided a semiconductor device wherein the first conductivity type is N-type and the second conductivity type is P-type, and the first insulated gate field effect transistor and the second insulated gate field effect transistor are connected in an inverter circuit.

According to a fifth aspect of the present invention, there is provided semiconductor device, wherein the first conductivity is P-type and the second conductivity is N-type. This semiconductor device further comprises a pair of MOS field effect transistors of N-type formed on the surface of the second well of P-type and the pair of MOS field effect transistors being connected in a source follower circuit.

According to a sixth aspect of the present invention, there is provided a semiconductor device, wherein the first conductivity type is P-type and the second conductivity type is N-type. This semiconductor device further comprises a pair of second wells of P-type being formed in the first well of N-type and an MOS field effect transistor of N-type formed on the surface of each second well of P-type and the pair of MOS field effect transistors being connected in a source follower circuit.

According to a seventh aspect of the present invention, there is provided a semiconductor device, wherein the first conductivity type is P-type and the second conductivity type is N-type. This semiconductor device further comprises a pair of first MOS field effect transistors of P-type formed on the surface of the first well of N-type, a pair of second MOS field effect transistors of N-type formed on the surface of the second well of P-type and the four MOS field effect transistors being connected in a NAND circuit.

The above and other objects, features, and advantages of the present invention will become apparent from the following detailed description of illustrative embodiments thereof to be read in conjunction with the accompanying drawings, in which like reference numerals are used to identity the same or similar parts in the several views.

DETAILED DESCRIPTION OF THE PREFERRED EMBODIMENTS

The present invention will now be described with reference to the drawings.

Figure 1:
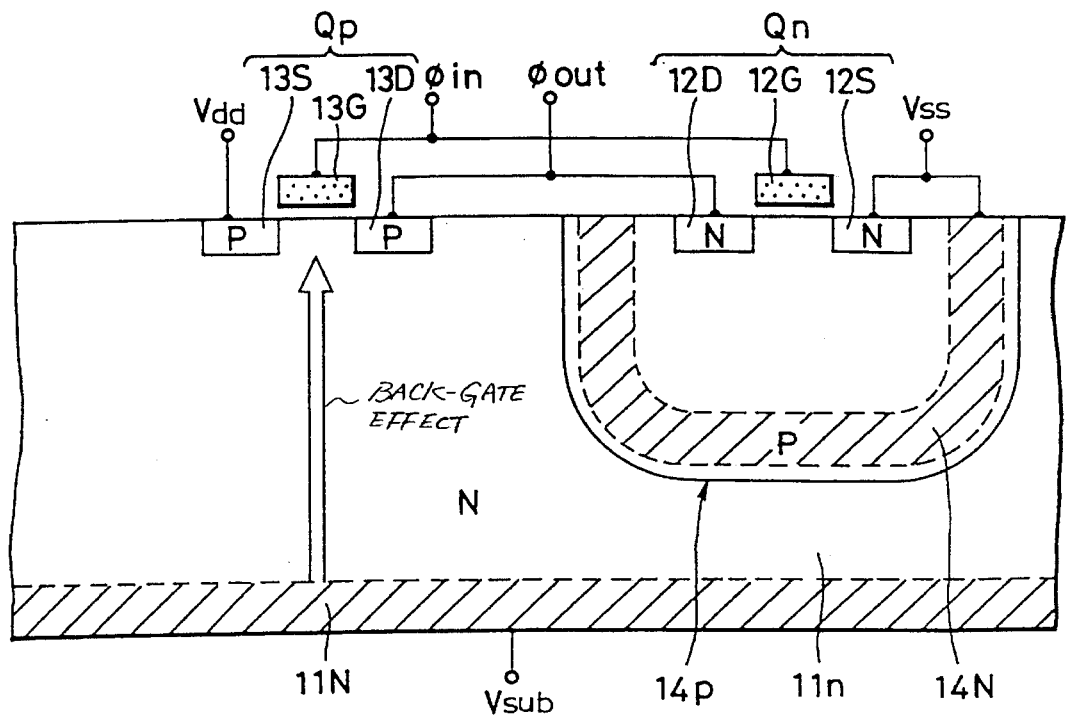
FIG. 1 is a cross-sectional view showing a structure of a an example of a conventional CMOS inverter.
Figure 2:
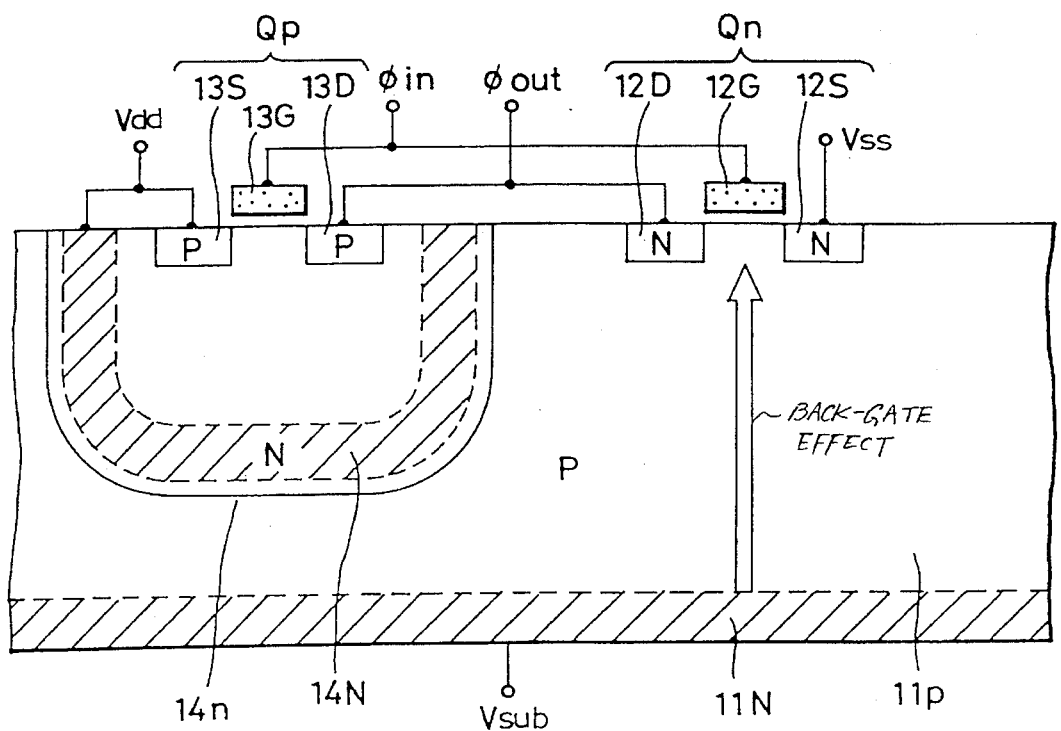
FIG. 2 is a cross-sectional view showing a structure of another example of a conventional CMOS inverter.
Figure 3:
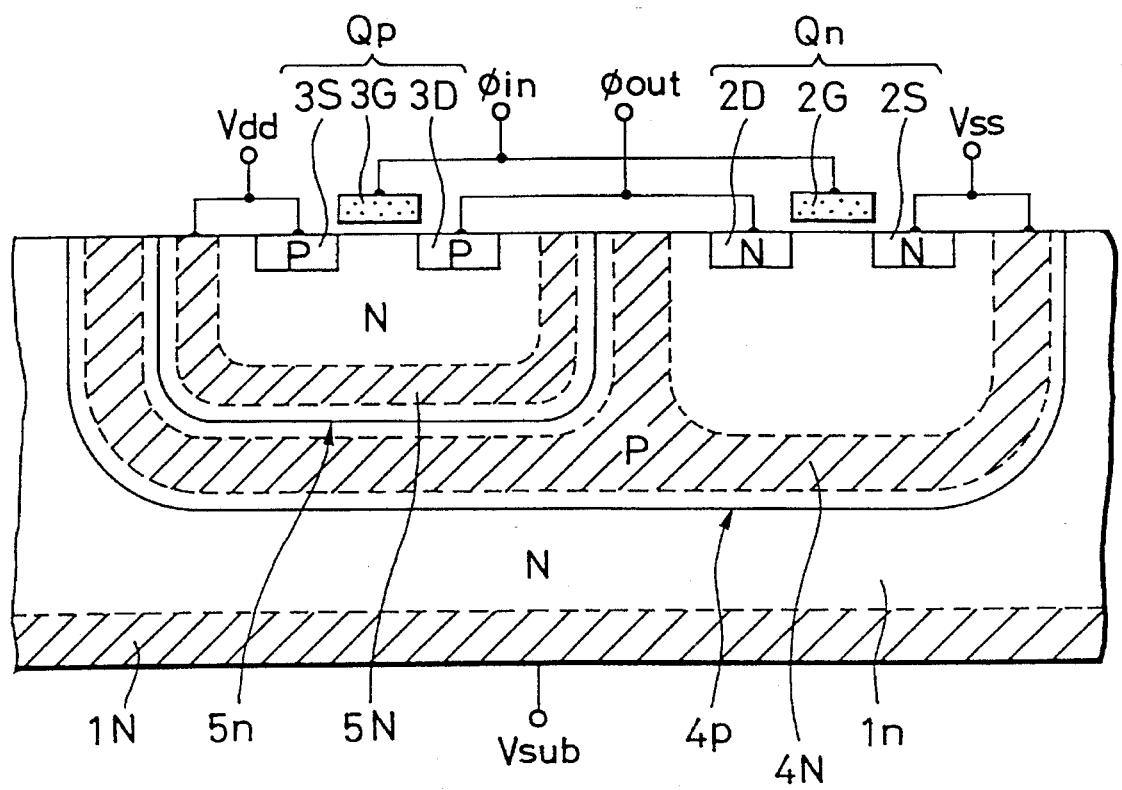
FIG. 3 is a cross-sectional view showing a structure of a CMOS inverter according to a first embodiment of the present invention.

FIG. 3 is a cross-sectional view showing a structure of a semiconductor device, e.g., CMOS inverter according to a first embodiment of the present invention.

As shown in FIG. 3, this CMOS inverter includes an N-type silicon substrate $1n$, for example, on which there are formed an N-channel type MOS field effect transistor (hereinafter simply referred to as an N-FET) Qn formed of an N-type source region $2S$, a drain region $2D$ and a gate electrode $2G$ formed of a polycrystalline silicon layer or the like and a P-channel type MOS field effect transistor (hereinafter simply referred to as a P-FET) Qp formed of a P-type source region $3S$, a drain region $3D$ and a gate electrode $3G$ formed of a polycrystalline silicon layer or the like.

According to this embodiment, a P-type first well region $4p$ is formed under the N-FET (Qn) and the P-FET (Qp). An N-type second well region $5n$ is formed in the first well region $4p$ under the P-FET (Qp), thereby presenting a double-well structure. More specifically, the P-FET (Qp) is formed on the surface of the second well region $5n$ within the first well region $4p$ and the N-FET (Qn) is formed on the surface of the first well region $4p$ at its portion in which the second well region $5n$ is not formed.

A substrate potential Vsub is applied to the silicon substrate $1n$, a power source voltage Vdd is applied to the source region $3S$ and the second well region $5n$ of the P-FET (Qp) and a ground potential Vss is applied to the source region $2S$ and the first well region $4p$ of the N-FET (Qn), respectively.

Accordingly, respective neutral regions $1N$, $4N$ and $5N$ (shown hatched) in the substrate $1n$, the first well region $4p$ and the second well region $5n$ are fixed to the substrate potential Vsub, the ground potential Vss and the power source potential Vdd. An input signal is supplied to a common input terminal φin connected to the respective gate electrodes $2G$ and $3G$ so that an output signal (inverter output) is output from a common terminal φ out connected to the respective drain regions $2D$ and $3D$.

According to the first embodiment of the present invention, the N-FET (Qn) is separated at its channel from the substrate In by the first well region $4p$ and the P-FET (Qp) is separated at its channel from the substrate in by the first and second well regions $4p$ and $5n$. Therefore, when the CMOS inverter according to this embodiment is applied to a buffer circuit, a driving circuit or the like of the peripheral circuit of the image sensor formed of CCD, MOS or the like, even if the substrate potential Vsub is fluctuated in accordance with the electronic shutter operation and the reset operation, the back-gate effect applied to the N-FET (Qn) and the P-FET (Qp) from the substrate in can be prevented completely.

Therefore, according to the CMOS inverter of the first embodiment of the present invention, the N-FET (Qn) and the P-FET (Qp) can both be prevented from being affected by the back-gate effect from the substrate $1n$. Thus, the phase displacement and the malfunction relative to the pulse response from the image sensor peripheral logic circuit, the analog circuit or the like can be avoided.

Figure 4:
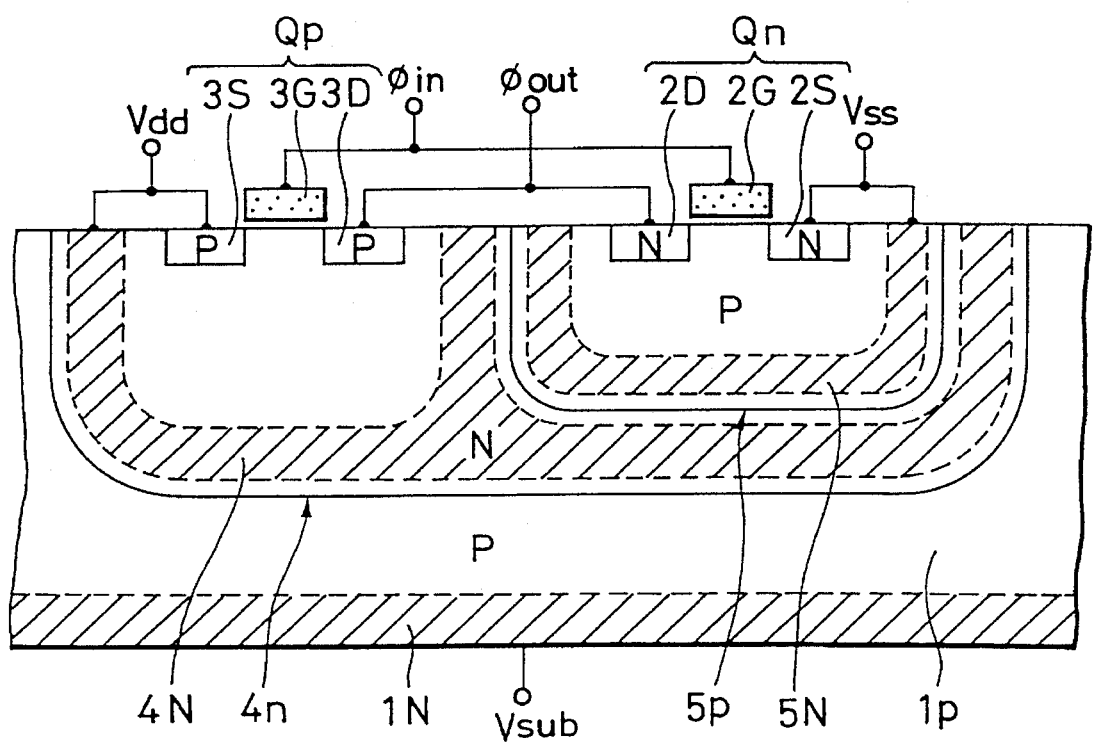
FIG. 4 is a cross-sectional view showing a structure of a CMOS inverter according to a second embodiment of the present invention.

A CMOS inverter according to a second embodiment of the present invention will be described with reference to FIG. 4. In FIG. 4, like parts corresponding to those of FIG. 3 are marked with the same references and therefore need not be described in detail. The CMOS inverter according to the second embodiment has substantially similar structure to that of the first embodiment and is different only in that it has an opposite conductivity type of impurity.

More specifically, as the silicon substrate, there is employed a P-type silicon substrate $1p$. The N-FET (Qn) is formed on the P-type second well region $5p$ within an N-type first well region $4n$. The P-FET (Qp) is formed on the surface of the first well region at its portion where the second well region $5p$ is not formed.

Similarly to the first embodiment, a substrate potential vsub is applied to the silicon substrate $1p$, a power source voltage Vdd is applied to the source region 3S and the first well region $4n$ of the P-FET (Qp) and a ground potential Vss is applied to the source region 2S and the second well region $5p$ of the N-FET (Qn), respectively. Accordingly, respective neutral regions 1N, 4N and 5N (shown hatched) in the substrate $1p$, the first well region $4n$ and the second well region $5p$ are fixed to the substrate potential Vsub, the ground potential Vss and the power source potential Vdd.

Therefore, according to the CMOS inverter of the second embodiment of the present invention, similarly to the first embodiment, when the CMOS inverter according to this embodiment is applied to a buffer circuit, a driving circuit or the like of the peripheral circuit of the image sensor formed of CCD, MOS or the like, even if the substrate potential Vsub is fluctuated in accordance with the electronic shutter operation and the reset operation, the back-gate effect applied to the N-FET (Qn) and the P-FET (Qp) from the substrate $1p$ can be prevented completely. Thus, the phase displacement and the malfunction relative to the pulse response from the image sensor peripheral logic circuit, the analog circuit or the like can be avoided.

While the semiconductor device of the present invention is applied to the CMOS inverter used in the peripheral circuit of the image sensor formed of CCD, MOS or the like as described in the first and second embodiments, the present invention is not limited thereto and may, of course, be applied to all circuits using CMOS.

Figure 5:
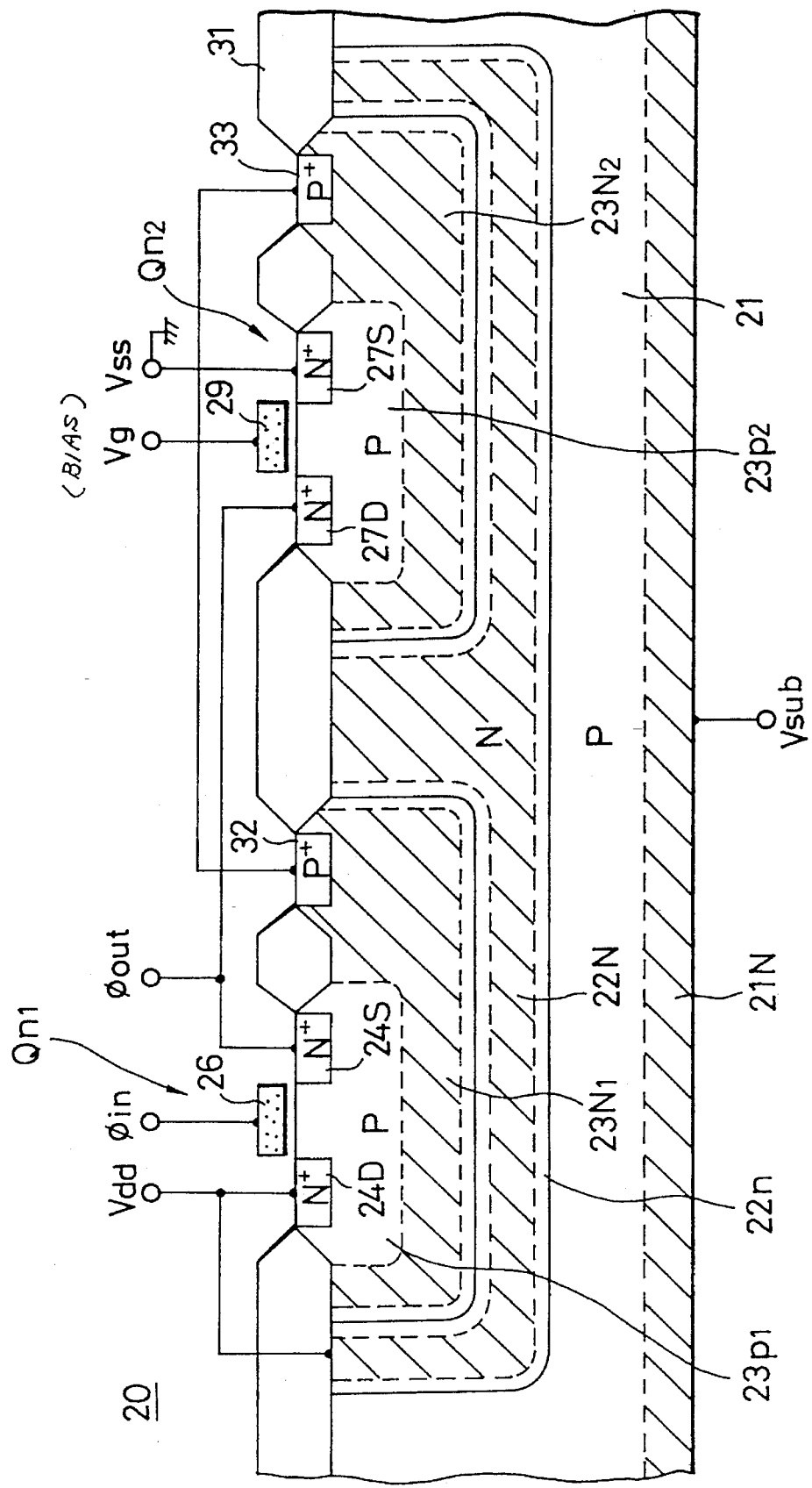
FIG. 5 is a cross-sectional view showing a structure of a source follower circuit according to a third embodiment of the present invention.

FIG. 5 shows a source follower circuit 20 according to a third embodiment of the present invention. According to this embodiment, as shown in FIG. 5, a first well $22n$ of a second conductivity type, i.e., N-type is formed on a silicon substrate 21 of a first conductivity type, i.e., P-type and two P-type second well regions $23p_1$ and $23p_2$ are formed within the first well region $22n$.

On one second well region $23p_1$, there is formed an N-channel type MOS field effect transistor, i.e., driving MOS transistor $Qn_1$ formed of a pair of N-type source region 24S and drain region 24D and a gate electrode 26 formed of a polycrystalline silicon layer or the like through a gate insulating layer. On the other second well region $23p_2$, there is formed an N-channel type MOS field effect transistor, i.e., load MOS transistor $Qn_2$ formed of a pair of N-type source region 27S and drain region 27D and a gate electrode 29 formed of a polycrystalline silicon layer or the like through a gate insulating layer. In FIG. 5, reference numeral 31 designates a field insulating layer formed by the selective oxidation process.

The substrate potential Vsub is applied to the silicon substrate 21, the power source voltage Vdd is applied to the drain region 24D and the first well region $22n$ of the driving MOS transistor $Qn_1$ and a ground potential Vss (so-called GND) is applied to the source region 27S and the respective well regions $23p_1$ and $23p_2$ of the load MOS transistor $Qn_2$. In FIG. 5, reference numerals 32 and 33 depict contact high impurity regions formed on the second well regions $23p_1$ and $23p_2$, respectively.

Accordingly, the respective neutral regions 21N, 22N, $23N_1$ and $23N_2$ (shown hatched) in the substrate 21, the first well region $22n$ and the second well regions $23p_1$, $23p_2$ are respectively fixed to the substrate potential Vsub, the power source potential Vdd and the ground potential Vss. An input signal is supplied to the input terminal φin connected to the gate electrode 26 of the driving MOS transistor $Qn_1$ so that an output signal is output from the common output terminal φout connected to the respective source region 24S and drain region 27D. A bias voltage Vg is applied to the gate electrode 29 of the load MOS transistor $Qn_2$.

According to the source follower circuit of the third embodiment of the present invention, the driving MOS transistor $Qn_1$ and the load transistor $Qn_2$ are separated at their channels from the substrate 21 by the first well region $22n$ and the second respective well regions $23p_1$ and $23p_2$. Therefore, when the source follower circuit is applied to the buffer circuit, the driving circuit or the like of the peripheral circuit of the image sensor formed of CCD, MOS or the like, even if the substrate potential Vsub is fluctuated in accordance with the electronic shutter operation, the back-gate effect applied to the driving MOS transistor Qn and the load MOS transistor $Qn_2$ from the substrate 21 can be prevented completely.

Therefore, in the source follower circuit according to the third embodiment of the present invention, the driving MOS transistor $Q_n$ and the load MOS transistor $Qn_2$ can both be prevented from being affected by the back-gate effect from the substrate 21. Thus, the phase displacement and malfunction relative to the pulse response such as the image sensor peripheral logic circuit, the analog circuit or the like can be avoided.

Figure 6:
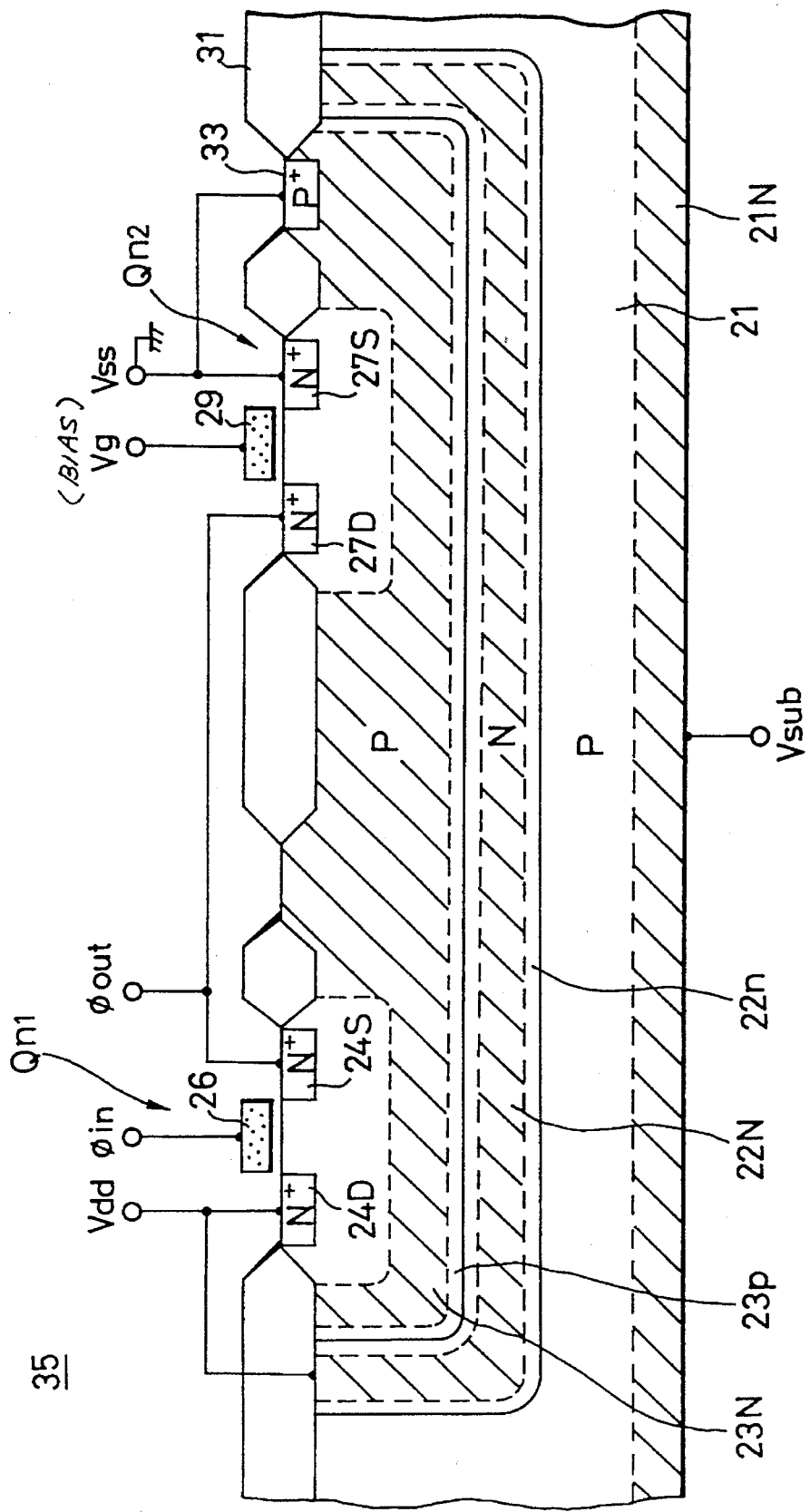
FIG. 6 is a cross-sectional view showing a structure of a source follower circuit according to a fourth embodiment of the present invention.

FIG. 6 shows a source follower circuit 35 according to a fourth embodiment of the present invention. In FIG. 6, like parts corresponding to those of FIG. 5 are marked with the same references and therefore need not be described in detail. according to this embodiment, on the first conductivity type, e.g., P-type silicon substrate 21, there is formed a second conductivity type, i.e., N-type well region $22n$. A P-type second well region $23p$ is formed within the first well region $22n$. Within the common second well region $23p$, there are formed two N-type channel field effect transistors, i.e., driving MOS transistors $Qn_1$ and a load transistor $Qn_2$.

Similarly to the third embodiment, the substrate potential Vsub is applied to the silicon substrate 21, the power source voltage Vdd is applied to the drain region 24D and the first well region $22n$ of the driving MOS transistor $Qn_1$, and the ground potential Vss (so-called GND) is applied to the source region 27S and the second well region $23p$ of the load MOS transistor $Qn_2$. The bias voltage Vg is applied to the gate electrode 29 of the load MOS transistor $Qn_2$. The input signal is supplied to the input terminal φin connected to the gate electrode 26 of the driving MOS transistor $Qn_1$ so that the output signal is output from the common terminal φout connected to the respective source region 24S and the drain region 27D. A plurality of P-type high concentration regions 33 may be formed in response to the resistance of the second well region $23p$ and may be applied with the power source voltage Vdd, respectively.

Accordingly, the neutral regions 21N, 22N and 23N (shown hatched) in the substrate 21, the first well region $22n$ and the second well region $23p$ are respectively fixed to the substrate potential Vsub, the power source potential Vdd and the ground potential Vss.

Similarly to the third embodiment, when the source follower circuit 35 of the fourth embodiment is applied to the buffer circuit, the driving circuit of, for example, the peripheral circuit of the image sensor formed of CCD, MOS or the like, even if the substrate potential Vsub is fluctuated in accordance with the electronic shutter, the back-gate effect applied to the driving MOS transistor $Q_n$ and the load MOS transistor $Qn_2$ from the substrate 21 can be prevented completely. Therefore, the phase displacement and the malfunction relative to the pulse response such as the image sensor peripheral logic circuit, the analog circuit or the like can be avoided.

While the semiconductor device according to the above embodiments is applied to the analog circuit, the present invention is not limited thereto and may be applied to a digital circuit such as a logic circuit.

Figure 7:
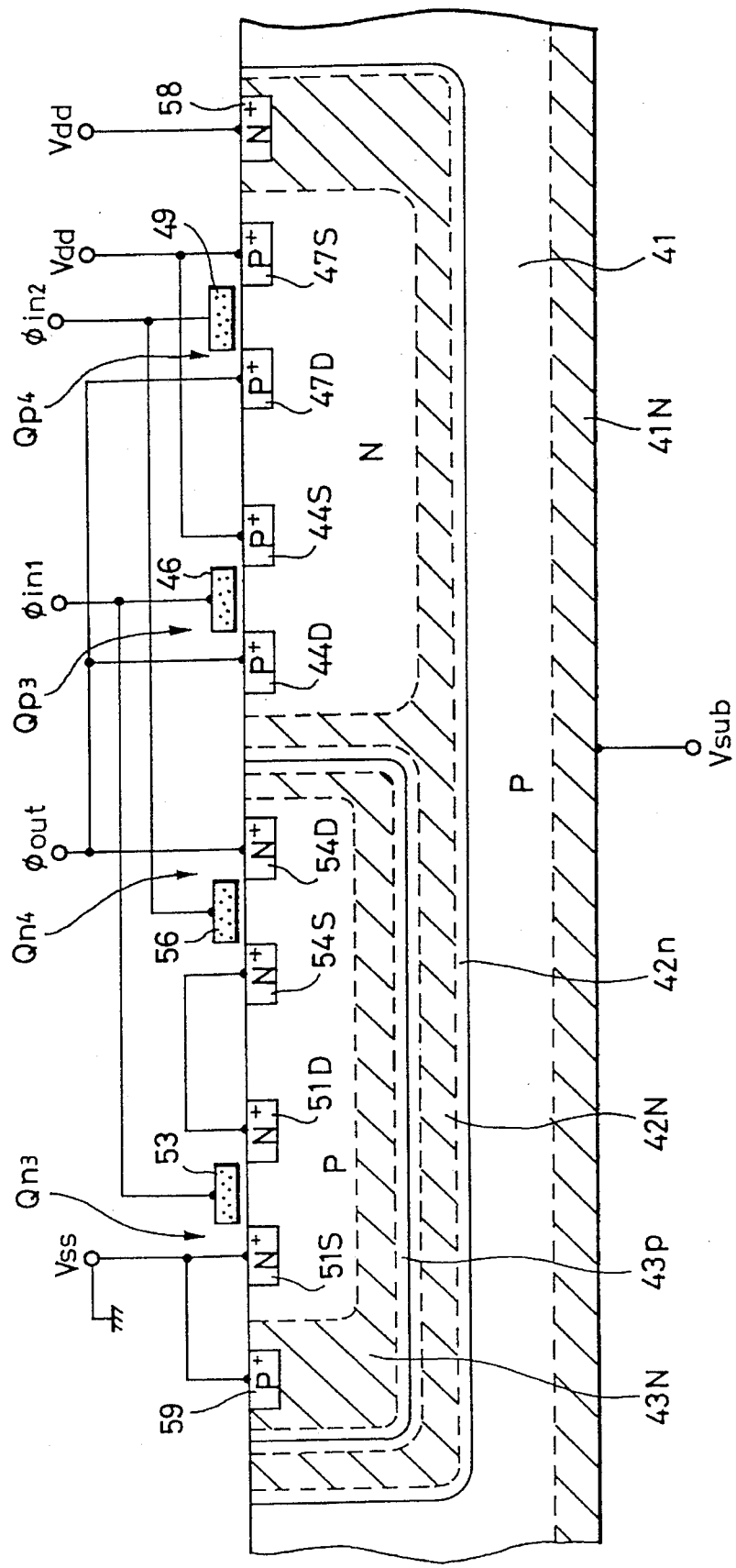
FIG. 7 is a cross-sectional view showing a structure of a NAND circuit according to a fifth embodiment of the present invention.

FIG. 7 shows a fifth embodiment of the present invention that the semiconductor device of the present invention is applied to a logic circuit, e.g., a NAND circuit 40. In this embodiment, a second conductivity type, i.e., N-type first well region 42n is formed on a first conductivity type, i.e., P-type silicon substrate 41. A P-type second well region 43p is formed within the first well region 42n.

Within the N-type first well region 42n, there are formed two P-channel type field effect transistors, i.e., a first P-FET ($Qp_3$) formed of a pair of P-type source region 44S and drain region 44D and a gate electrode 46 formed of a polycrystalline silicon layer or the like through a gate insulating layer and a second P-FET ($Qp_4$) formed of a pair of P-type source region 47S and drain region 47D and a gate electrode 49 formed of a polycrystalline silicon layer or the like through a gate insulating layer.

Further, within the P-type second well region 43p, there are formed two N-channel type field effect transistors, i.e., a first N-FET ($Qn_3$) formed of a pair of N-type source region 51S and drain region 51D and a gate electrode 53 formed of a polycrystalline silicon layer or the like through a gate insulating layer and a second N-FET ($Qn_4$) formed of a pair of N-type source region 54S and drain region 54D and a gate electrode 56 formed of a polycrystalline silicon layer or the like through a gate insulating layer.

The substrate potential Vsub is applied to the silicon substrate 41, the power source voltage Vdd is commonly applied to the source region 44S and source region 47S of the first and second P-FETs ($QP_3$) and ($QP_4$), and the N-type first well region 42n, i.e., a contact P-type high concentration region 58, and the ground potential (so-called GND) is commonly applied to the source region 51S of the first N-FET ($Qn_3$) and the P-type second well region 43p, i.e., a contact N-type high concentration region 59. Accordingly, the neutral regions 41N, 42N and 43N (shown hatched) in the substrate 41, the second well region 42n and the second well region 43p are respectively fixed to the substrate potential Vsub, the ground potential Vss and the power source potential Vdd.

The drain region 51D of the first N-FET ($Qn_3$) and the source region 54S of the second N-FET ($Qn_4$) are commonly connected. Input signals are respectively supplied to a first input terminal $\phi in_1$ commonly connected to the gate electrode 53 of the first N-FET ($Qn_3$) and the gate electrode 46 of the first P-FET ($QP_3$) and a second input terminal $\phi in_2$ commonly connected to the gate electrode 56 of the second N-FET ($Qn_4$) and the gate electrode 49 of the second P-FET ($Qp_4$) so that an output signal is output from an output terminal $\phi out$ commonly connected to the drain region 54D of the second N-FET ($Qn_4$) and the drain region 47D of the second P-FET ($QP_4$).

Figure 8:
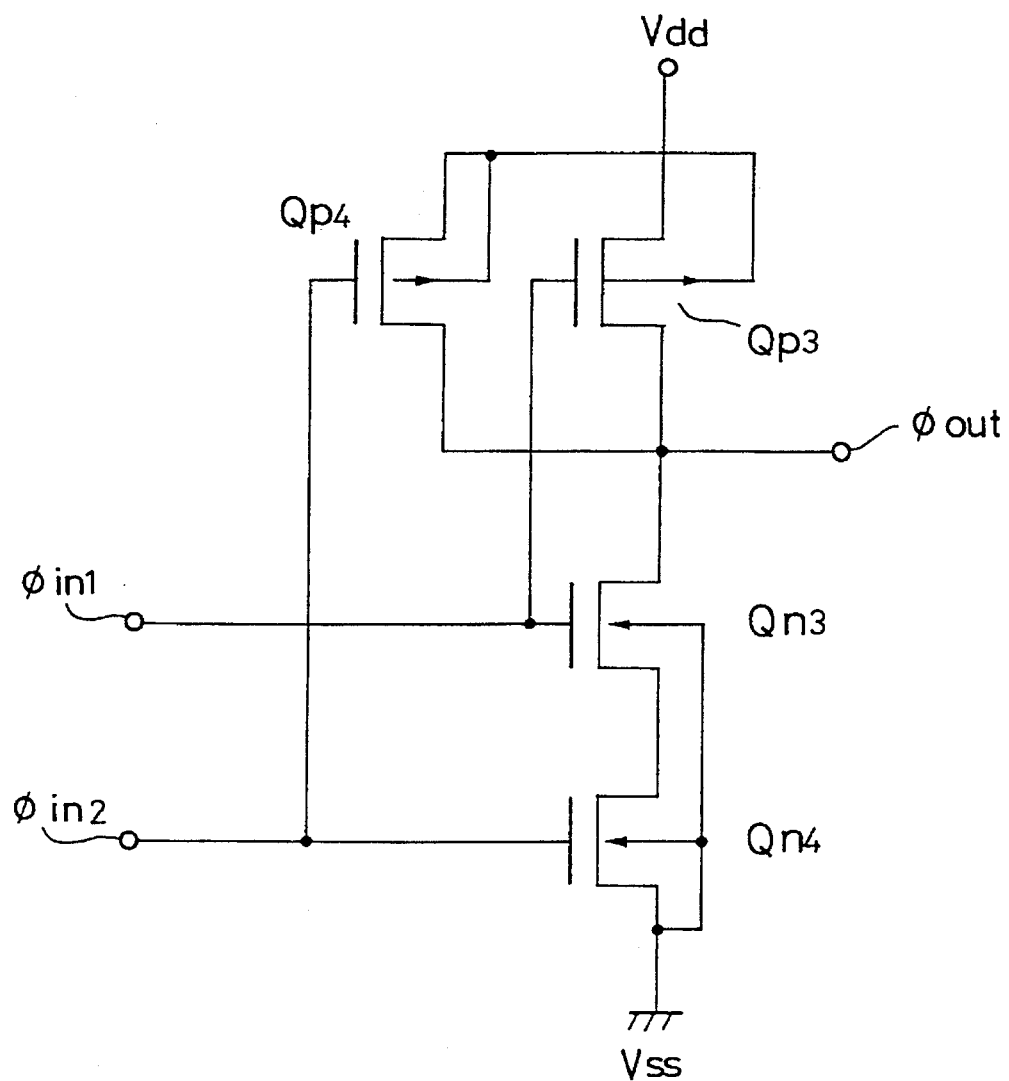
FIG. 8 is a diagram of an equivalent circuit of the NAND circuit shown in FIG. 7.

FIG. 8 shows an equivalent circuit of the NAND circuit 40.

Also, in the case of the NAND circuit 40 according to the fifth embodiment, the two P-FETs ($Qp_3$) and ($Qp_4$) are separated at their channels from the substrate 41 by the first well region 42n. Further, the two N-FETs ($Qn_3$) and ($Qn_4$) are separated at their channels from the substrate 41 by the first and second well regions 42n and 43p. Therefore, even when the substrate potential Vsub is fluctuated, the back-gate effect to the N-FETs ($Qn_3$), ($Qn_4$) and the P-FETs ($Qp_3$), ($Qp_4$) from the substrate can be avoided completely. Thus, the phase displacement relative to the pulse response to the image sensor peripheral logic circuit, the malfunction or the like can be avoided.

According to the semiconductor device of the present invention, an influence brought about by the back-gate effect from the substrate can be prevented completely and the phase displacement relative to the pulse response of the image sensor peripheral logic circuit, the analog circuit or the like can be avoided.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device having a semiconductor substrate supplied with a fluctuating voltage comprising:

said semiconductor substrate of a first conductivity type;

a first well of a second conductivity type formed in said semiconductor substrate;

a second well of the first conductivity type formed in said first well;

and, wherein said first conductivity type is P-type and said second conductivity type is N-type, and wherein the device further comprising:

a pair of first MOS field effect transistors of P-type formed on the surface of said first well of N-type;

a pair of second MOS field effect transistors of N-type formed on the surface of said second well of P-type; and said four MOS field effect transistors being connected in a NAND circuit.

2. A semiconductor device according to claim 1 wherein said second well is connected to a ground potential and said first well is connected to a power source.

* * * * *